(12) United States Patent
Bach (10) Patent No.: US 8,466,405 B2
(45) Date of Patent: Jun. 18, 2013

(54) PHOTORECEIVER ARRANGEMENT WITH A PHOTORECEIVER AND A METHOD FOR OPERATING A PHOTORECEIVER THAT CONVERTS AN OPTICAL DATA FLOW INTO A HIGH-FREQUENCY OUTPUT SIGNAL

(75) Inventor: Heinz-Gunter Bach, Berlin (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 294 days.

(21) Appl. No.: 12/881,532

(22) Filed: Sep. 14, 2010

(65) Prior Publication Data

US 2011/0062315 A1    Mar. 17, 2011

(30) Foreign Application Priority Data

Sep. 16, 2009    (DE) .......................... 10 2009 041 774

(51) Int. Cl.
*H01J 40/14*    (2006.01)
*H04B 10/06*    (2006.01)

(52) U.S. Cl.
USPC ..................................... 250/214 R; 398/202

(58) Field of Classification Search
USPC ........................................ 250/214 R; 398/202
See application file for complete search history.

(56) References Cited

U.S. PATENT DOCUMENTS 5,477,370 A * 12/1995 Little et al. .................... 398/202

OTHER PUBLICATIONS

Bach, Heinz-Gunter, et al., "Design and Fabrication of 60-Gb/s InP-Based Monolithic Photoreceiver OEICs and Modules", IEEE Journal of Selected Topics in Quantum Electronics, vol. 8, No. 6, (Nov. 2002), 6 pgs.

* cited by examiner

*Primary Examiner* — Thanh Luu
(74) *Attorney, Agent, or Firm* — Schwegman Lundberg & Woessner, P.A.

(57) ABSTRACT

A photodetector arrangement with a photoreceiver which comprises a photodiode, a blocking capacitor for high frequency and a terminal resistance lying at the signal output of the photodiode, is suggested. The photodiode is connected to a first bias connection for the supply with a blocking voltage, and a second bias connection is connected to the terminal resistance for the control of the potential at the signal output. A further blocking capacitor is provided for the high-frequency-technological earthing of the terminal resistance.

13 Claims, 7 Drawing Sheets

PHOTORECEIVER ARRANGEMENT WITH A PHOTORECEIVER AND A METHOD FOR OPERATING A PHOTORECEIVER THAT CONVERTS AN OPTICAL DATA FLOW INTO A HIGH-FREQUENCY OUTPUT SIGNAL

CLAIM OF PRIORITY

The present patent application claims the benefit of priority under 35 U.S.C. §119 to German Patent Application No. 10 2009 041 774.5, filed Sep. 16, 2009, the entire contents of which is incorporated herein by reference in its entirety.

This patent document relates to a photoreceiver arrangement and to a method for operating a photoreceiver.

Figure 1:
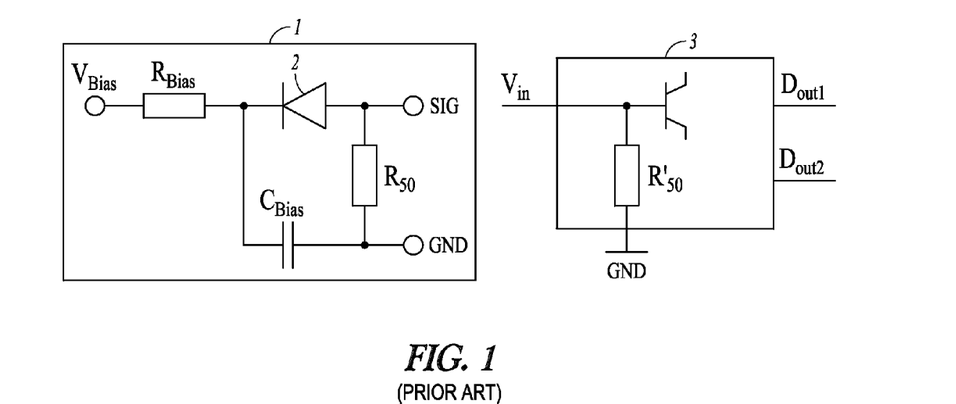
FIG. 1 a circuit design of a photoreceiver with a rear-side bias feed and, and a demultiplexer according to the state of the art, which is to be connected subsequently, FIG. 2 a photodiode receiver and a subsequently connected demultiplexer, which are connected to one another with the help of a highest-frequency bias-Ts, according to the state of the art, FIG. 3 the circuit design of a photoreceiver according to the invention, with a subsequently connected demultiplexer, FIG. 4 one embodiment example of the photoreceiver according to the invention, as a monolithically integrated optoelectronic componentry in waveguide integration, with a layer construction, FIG. 5 a mask layout of a photoreceiver according to the invention, with an anode at the signal output, FIG. 6 frequency responses of four photoreceivers according to the invention, with a different anode-cathode circuiting of the photodiode, FIG. 7 eye patterns measured at the output of the photoreceiver, amid the application of the operating point displacement, acting at the signal output.

Ultra-rapid photoreceivers, which operate in the serial 100 Gbit/s data rate range and are designed for the D.C. voltage coupling to subsequent electronic circuits, e.g. a demultiplexer circuit (DEMUX), according to the state of the art, in the simplest case consist of a pin-photodiode. In FIG. 1, a pin-photoreceiver 1 according to the state of the art is shown, which has a rear-side bias feed. The photoreceiver 1 converts an optical data flow, which is coupled into the photodiode 2 via a glass fibre, into an electrical output signal of the same data rate. According to FIG. 1, the known photoreceiver 1, which may be integrated on a chip, may comprise a connection $V_{bias}$ which via a resistance $R_{bias}$, in the represented state of the art, is connected to the cathode of the photodiode 2. The anode of the photodiode 2 is connected to a signal output SIG, wherein a terminal resistance $R_{50}$ is connected between the signal output SIG and earth (GND). A blocking capacitor $C_{bias}$ lies between the cathode of the photodiode 2 and earth (GND). The photoreceiver 1 or the photodiode 2 is supplied with a blocking voltage via the connection $V_{bias}$. The resistance $R_{50}$ serves for the reduction of the RC-constant for achieving greater limit frequencies and for avoiding reflections, which may run from connected electronics to the photoreceiver and which would degrade the signal integrity with a renewed reflection.

In FIG. 1, a demultiplexer DEMUX is represented on the right, which is connected to the output of the photoreceiver 1 and receives the high-frequency exit signal of the photoreceiver 1, which is likewise designed as an IC, and in the represented example demultiplexes a 100 Gbit/s electrical data signal into two data signals with 50 Gbits/s, which appear at its outputs $D_{out1}$ and $D_{out2}$. The demultiplexer is only represented in an indicated manner, and has an input resistance $R_{i50}$. Here, only its electrical input $V_{in}$, is to be mentioned, whose maximal voltage swing is to lie in a safe operating region of typically −0.6V to +0.4 V, wherein in many cases the best switching behaviour is achieved if the average D.C. voltage at the input $V_{in}$, lies around 0V. Usually from the outside, a certain D.C. voltage operating point is defined at the connection $V_{in}$, said operating point ensuring an optimal switching threshold.

With a direct circuiting together of the photoreceiver 2 and the demultiplexer 3, the average photocurrent would displace the input potential of the demultiplexer 3 into the positive, in a manner dependent on the illumination, and with realistic photocurrents in the 5-10 mA region, to such an extent that an optimal switching procedure of the demultiplexer no longer occurs. Moreover, according to the state of the art, the demultiplexer circuits at their input, are extremely sensitive to overvoltages since, with the high switch frequencies, it is hardly possible to provide the sensitive input transistors with protective circuits against voltage peaks, which would immediately reduce the frequency limit. Accordingly, the user, who connects a photoreceiver chip in series in front of a demultiplexer IC, must ensure that possible voltage peaks and also DC-offsets remain within tight tolerances, otherwise one is to reckon with the functional failure or loss of the demultiplexer-IC. The photoreceiver and demultiplexer ICs in the 100 Gbit/s region, are at present very expensive circuits.

Figure 2:
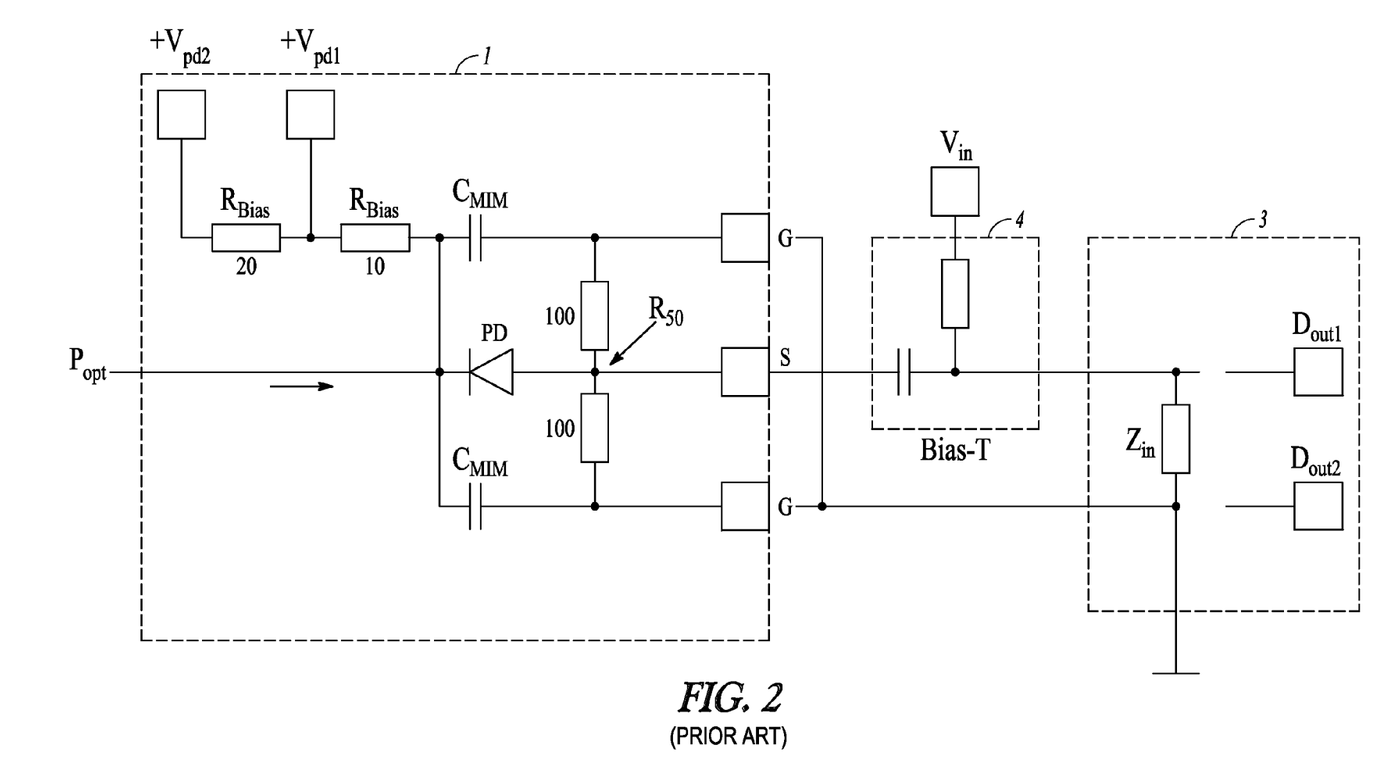

In order to utilise all flexibilities for the setting of the operating point at the input of the demultiplexer 3 and to rule out risks of transient overvoltage impulses, the intermediate connection of a so-called bias-Ts 4 has become commonplace, as is represented in FIG. 2, which shows an embodiment of a photoreceiver 1 in a coplanar design and of a demultiplexer 3, which are connected by way of a bias-T 4. The bias-T 4 comprises a capacitor lying in the signal line, and a resistance or inductance leading to a setting connection $V_{in}$. In the represented photoreceiver 1, the bias connection is divided into two part connections $+V_{pd2}$ and $+V_{pd1}$, wherein in a corresponding manner, the resistance $R_{bias}$ is divided into two part resistances for example of 20 and 10 Ohm. At the same time, two earth lines and two terminal resistances are provided between the signal output and the earth line, which in each case are 100 Ohms and together form the terminal resistance $R_{50}$. In each case, a blocking capacitor $C_{MIM}$ is connected in the lines between the cathode and the photodiode PD and the earth connection G.

The bias-Ts which are used in a circuit according to FIG. 2, must be suitable for limit frequencies in the 100 GHz region and also down to limit frequencies of at least 100 KHz, in order with this, to be able to transmit the signal bandwidth, as well as the so-called frame clock. They are therefore likewise expensive. Moreover, they reduce the bandwidth, damp the high-frequency output signal by about 2 dB and thus destroy a part of the conversion efficiency of the photodiode.

If in pre-development stages, the photoreceiver 1 and the demultiplexer 3 are present in separate housings, an intermediate connection of a bias-T 4 is easily possible, even if burdened by the disadvantages previously mentioned. However, with a so-called co-packaging, one attempts to bring both components into a single housing, in order on the one hand to save housing costs and on the other hand to also reduce the signal damping between both optoelectrical ICs (OEIC), which would otherwise additionally result due to the necessary high-frequency connection plug and high-frequency lines (approx. 2 dB per housing). Moreover, in this preferred co-packaging design, only medium-frequency signals leave the housing, so that connection costs for high-frequency plugs may be saved. If this preferred co-packaging case is present, then both OEICs are packaged together in a tight manner in one housing and directly connected to ultra-short bond wires. In this embodiment however, one may no longer introduce any bias-T. Thus also the photocurrent-dependent control possibility of the input voltage $V_{in}$ of the multiplexer 3 or another downstream connected circuit would not be given.

It therefore can be an objective to provide a photoreceiver arrangement or a method for operating a photoreceiver, which permits a simple and preferably linear possibility for the control and setting of the input voltage potential of a subsequent circuit, such as a multiplexer or an amplifier, wherein a direct D.C. coupling between the photoreceiver and the subsequently connected electronic circuit should be able to be realised in a manner, such that one may make do without the standard bias-T, and a co-packaging becomes possible. Moreover, costs should be saved and thus an inexpensive design achieved.

According to an embodiment of the invention, this objective can be achieved by the features of the independent claim relating to the receiver arrangement, and the features of the independent method claim.

Advantageous further formations and improvements are possible by way of the features specified in the dependent claims.

By way of the fact that additionally to the first bias connection, a second bias connection is provided, which is connected to the terminal resistance for controlling and setting the potential at the signal output of the photoreceiver, and that a further blocking capacitor for high-frequency technological earthing of the terminal resistance is provided, the potential of the terminal resistance may be controlled or set in a suitable manner from the outside, so that subsequent electronics, such as e.g. an amplifier or a demultiplexer circuit, may be optimally set with regard to their input switching threshold, by which means possible shifts of the input potential may be counteracted dependent on the illumination. An intermediate connection of a bias-Ts is no longer necessary, so that the high-frequency signal may be transmitted into the subsequent electronics in an undamped manner and moreover a co-packaging may be realised by way of short bond wires, and the photoreceiver and subsequent electronics may be packaged together in the tightest manner in a housing.

In a preferred embodiment example, for achieving a coplanar arrangement and for the high-frequency-technological symmetrisation, one may "play" components, e.g., two earth lines with corresponding connections are provided, and the further blocking capacitor and the preferably ohmic and linear terminal resistance are in each case divided into two part elements. However, also other lines such as micro-stripe lines (leads), CPS (coplanar stripes), are possible, independently of the design in the coplanar waveguide.

Advantageously, the first bias connection for the rear side blocking voltage feed may be divided into two part-bias-connections, by which means a variable setting of the blocking voltage for the photodiode is possible and the protective effect with regard to electrical overvoltages is increased.

The photodiode may be designed in different manners, for example as a pin-photodiode, MSM-photodiode (metal semiconductor metal), as an avalanche photodiode (APD) or as a photoconductor. It itself may be integrated vertically or also laterally, be designed as a pin-Mesa diode or in a variant of the lateral illumination from a waveguide or in a waveguide integration for evanescent light coupling. Moreover photodiodes, blocking capacitors, terminal resistance connection resistance and bias connections may be integrated on a chip and also a possible subsequently connected electronic circuit such as demultiplexer and amplifier, for example travelling wave amplifier, may be integrated on the same chip and/or be packaged in a tight manner in a housing. Of course, as was hitherto the case, the photoreceiver and subsequent electronic circuit may be accommodated in separate housings, wherein their electric connection may then be carried out in a direct manner and one does not need to provide an intermediate circuit such as the bias-T.

The photodiode may be arranged in the photoreceiver in a manner such that the anode or the cathode is directed to the signal output. In an advantageous manner, the potential at the bias connections is selected depending on the polarity (anode-cathode) of the photodiode within the circuit, allowing to receive by means of the photodiode which can be always operated in reverse-biasing positive or negative electrical pulses from the optical input pulse in an optional way.

The advantages mentioned above are briefly concluded. The new type of photoreceiver (bias-feeding photodiode receiver) and an integrated circuit, such as a demultiplexer-IC or an amplifier-IC, such as a travelling wave amplifier, may be directly connected in a DC-coupled manner without high-frequency damping losses, wherein an exact linear control of the voltage potential of the input of the subsequent circuit is given, without measurement tappings or bias-Ts becoming necessary at the sensitive high-frequency signal line. The DC coupling of the two optoelectronic OEICs, which may now be operated with this, avoids noticeable high-frequency damping, which in the separately housed case, lies in the region of approximately 6 dB, and additionally saves the high costs for a highest-frequency bias-T. With this, both OEICs may be constructed in a tightly packed manner in a single housing and may be operated in a manner which is optimal with regard to the operating point and which is safe.

An embodiment of the invention may particularly advantageously be applied for highest frequencies, but it may also be applied in a lower frequency rage.

Embodiment examples of the invention are represented in the drawings and are explained in more detail in the subsequent description. There are shown in.

Figure 3:
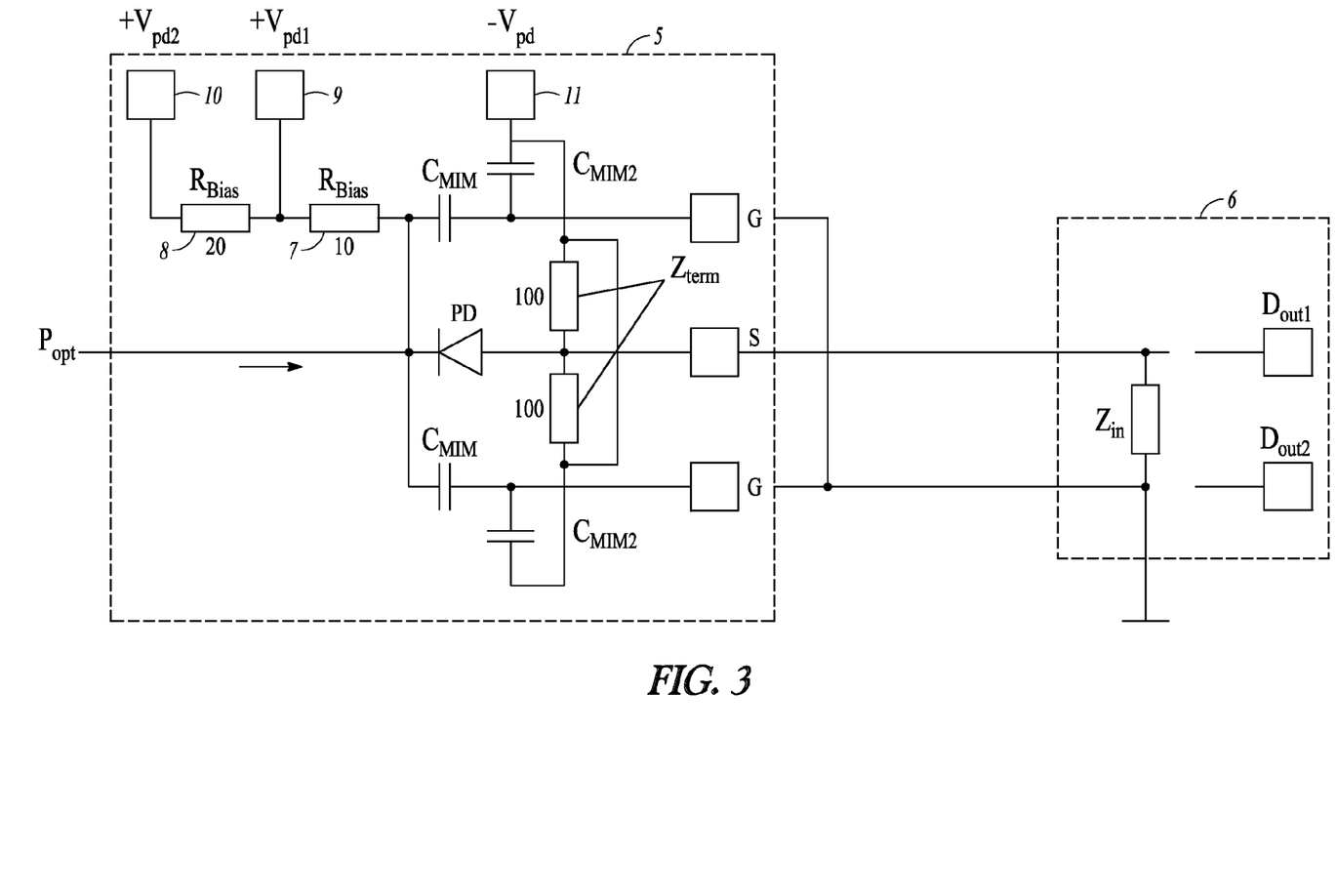

A circuit design of the photoreceiver arrangement according to an embodiment of the invention is represented in FIG. 3, wherein a photoreceiver 5 and a demultiplexer 6 are provided as a subsequently connected electronic circuit. The photoreceiver 5 is monolithically integrated on a chip, and in the same manner, the demultiplexer 6 is constructed as an integrated circuit on or in a chip. Basically, the receiver 5 is constructed in a similar manner to the receiver according to FIG. 2 and the description of FIGS. 1 and 2 also apply to the embodiment according to FIG. 3. The photodiode PD is connected such that the anode points to the signal output S and the cathode is connected in each case to a blocking capacitor $C_{MIM}$ which are also connected to the ground connections G. The cathode of the photodiode PD is connected via a resistance 7 and a resistance 8, to a first bias connection, which comprises the two part connections 9, 10 which are also indicated at $+V_{pd2}$ and $+V_{pd1}$. As an example of what is different to the cited state of the art according to FIG. 2, is that here a second bias connection 11 which is also indicated at $-V_{pd}$ is provided, which via in each case a further blocking capacitor $C_{MIM2}$, is connected in a high-frequency manner to the respective earth line or the respective ground connection of the coplanar waveguide. Moreover, the terminal resistance $Z_{term}$ which is a linear, ohmic resistance is connected to the second bias connection 11, and is divided into two part resistances and is connected to the signal output S.

The demultiplexer 6 is merely indicated by its input resistance $Z_{in}$ and by two output connections $D_{out1}$ and $D_{out2}$, wherein the input resistance is connected to the signal output S and to the ground connections G of the photoreceiver 1. This connection represents a direct D.C. voltage coupling, which in the co-packaging case is realised by way of ultra short multiple bond-wires.

The part-bias connections 9 and 10 of the photoreceiver 5 set the blocking voltage for the rear-side bias feed to the photodiode PD, whilst the second bias connection 11 permits the external linear control of the potential of the terminal resistance $Z_{term}$ of e.g. 50 Ohm, which is connected in a modified manner via the further blocking capacitor $C_{MIM2}$ and is integrated in the chip, as a parallel circuit, from the 2×100 Ohms. With regard to high-frequency technology, the cold end, i.e. the end of the integrated linear terminal resistance which is directed to the earth line, is earthed as in the state of the art according to FIG. 2, which is realised by way of the further blocking capacitor $C_{MIM2}$ to the earth line or to the ground connection G. The signal path at the anode of the photodiode PD therefore envisages a linear 50 Ohm termination. In the represented embodiment example, with which the anode of the photodiode PD points to the signal output S, the part connections 9, 10 of the first bias connection are indicated at $+V_{pd2}$ and $+V_{pd1}$, whilst the second bias connection 11 is indicated at $-V_{pd}$. This is to indicate that an opposite current feed at the path "$-V_{pd}$", i.e. at the connection 11 takes place. Usually, in the case of circuiting to the connections 9, 10, a more positive voltage than at the bias connection is to be applied and basically one may state that the voltage at the connection 11 with regard to magnitude should be smaller than that at the connections 9 and 10.

Proceeding from the second bias connection 11, the tracing of the galvanic connection via the resistance $Z_{term}$ shows that the input potential of the demultiplexer 6 may be controlled or set in a direct manner. Thus one may counteract the photocurrent of the diode PD with the possibility of the opposite current feed, such that the desired potential may be set at the signal path. In practice, for a positive photocurrent from the anode of the photodiode, a suitably linearly related negative potential is applied at the connection 11, so that a compensation effect which is opposite to the photocurrent is achieved at the demultiplexer input. This may lead to a switching threshold at the demultiplexer input of for example 0V or also to another desired switching threshold potential. The high-frequency signal is transmitted to the demultiplexer in an undamped manner.

Figure 4:
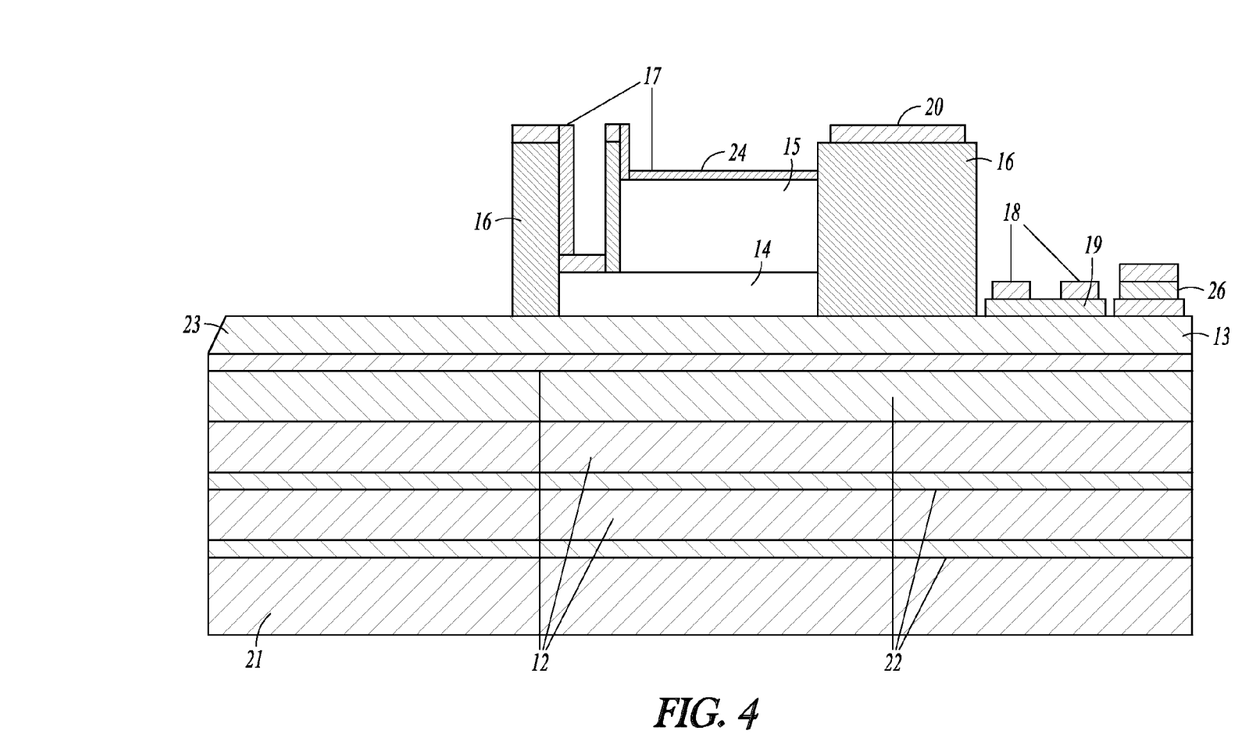

One embodiment example of a waveguide-integrated pin-photodiode in a vertical epitaxy layer sequence with integrated dielectrics and metallisation is shown in FIG. 4, wherein such a monolithically integrated photoreceiver in the form of an optoelectronic componentry is applied for the high frequency region. The layer construction has a InP:Fe substrate 21 and a layer sequence arranged thereon, of in total semi-insulating GaI-nAsP conductive layers 22 and InP spacer layers 12 arranged between these. The uppermost layer of the layer package, which is manufactured in an epitactic manner, is a GaInAsP:Fe semi-insulating waveguide layer 13 which has an input taper 23, into which light from a fibre is coupled. A photodiode 24 is arranged on or in the waveguide layer 13 and consists of a n-doped GaInAsP:Si contact layer 14 deposited on the waveguide layer 13, and of a p-contact layer, wherein the last two layers are grouped into the reference numeral 15. The waveguide-integrated photodiode 24 is surrounded or embedded by a first dielectric layer 16, which in the embodiment example is designed as a BCB-layer. Metal structurings 17 which are designed as suitable contacts and connection lines, are deposited on the layer arrangement of the waveguide-integrated photodiode 24 as well as the n-contact layer 14. The RC-elements as well as signal lines and DC bias lines are indicated by the metallisations 18, 19, 20 and 26. The circuiting of the pin-diode PD according to FIG. 3 is carried out with the help of the passive R-elements, C-elements and line elements 18, 19, 10, 26.

Figure 5:
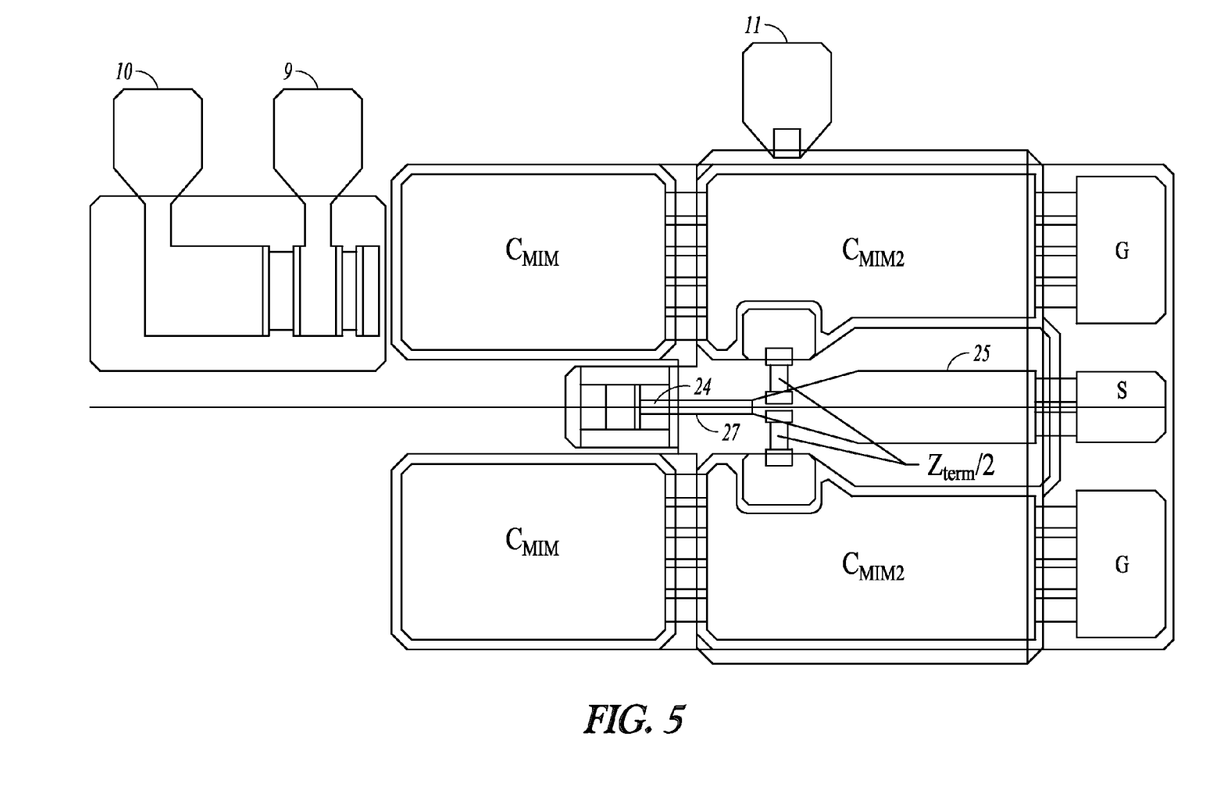

The mask layout and chip layout of the vertically integrated componentry according to FIG. 4 is represented in the circuit of FIG. 3 in FIG. 5. The photoreceiver (bias-feeding-photodiode chip) of the WG-PD type (waveguide-PD type) has an active pin-photodiode 24 with dimensions of 5×20 μm². The connection pads of the bias connections 9, 10, 11 geometrically correspond directly to the connections of FIG. 3. The capacitors $C_{MIM}$ may be recognised on both sides of the photodiode 24, and the further blocking capacitors $C_{MIM2}$ are arranged on both sides to the signal output line 25, wherein the parts of the linear, ohmic terminal resistance $Z_{term}$ are introduced into the terminal capacitors $C_{MIM2}$ in the layout and are connected to the signal output line 25. The connection of the pin-photodiode 24 to the signal output line is released via a shorter air bridge 27. The ground pads and the signal pad are indicated at G and S, as in FIG. 3

Figure 6:
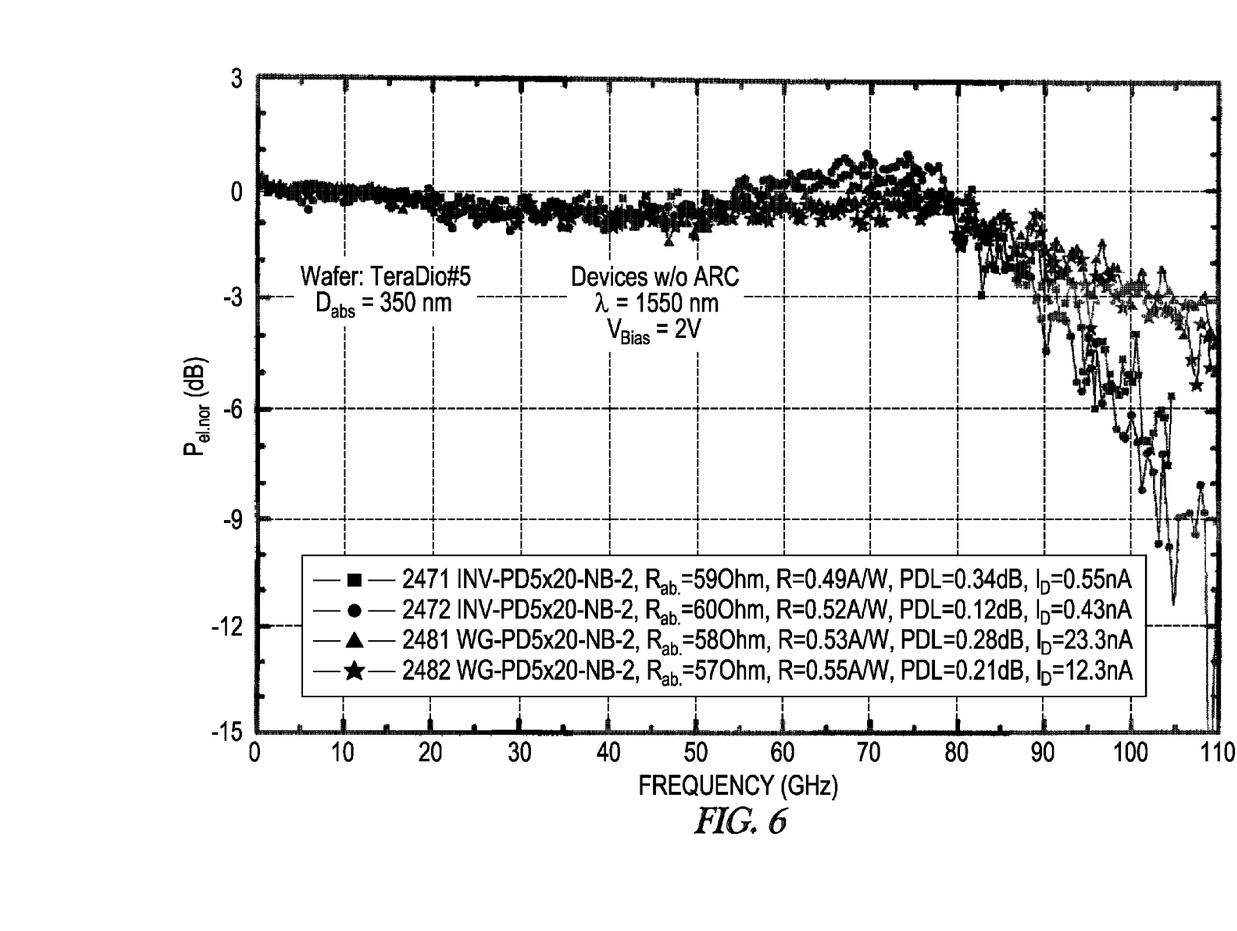

In FIG. 6, the frequency responses of four photoreceivers (bias feeding photodiodes) are measured with the optical heterodyne method on the chip level, represented with variations of the connection type of the pin-photodiode. $P_{EL:NOR}$ thereby indicates the electrical output power normalised to 0 dB at low frequencies. With diodes of the WG-D type, the anode, and with diodes of the INV-PD, the cathode is connected to the high-frequency signal output, by which means the user from the optical input pulse may obtain positive or negative electrical pulses from the photodiode in a selection-free manner. The symbols with the triangle and star show the frequency responses of the pin-diodes with the anode at the signal output (WG-PD) and the squares or circles on the curves indicate the pin-diodes with the cathode at the signal output (INV-D). The second bias connection 11 here was externally earthed and 2V blocking voltage was at the standard bias connection 9, 10. The achieved bandwidths are 90-105 GHz and thus equal to bandwidths of equally large passivated waveguide integrated photodiodes of known embodiments according to FIG. 1. As may be recognised from the legend, the responsivities of about 0.55 A/W (non anti-glared) were achieved and polarisation-dependent losses (PDL) of only <0.35 dB, which represent the best values. With this, no negative effects of the photoreceiver according to the invention may be recognised, so that the user may advantageously apply more linear and flexible biasing concepts whilst using the second bias connection 11 in the DC-coupling with subsequent electronics, without having to fear high-frequency losses.

Figure 7A:
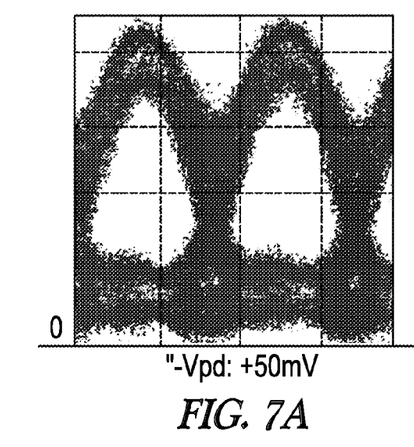
Figure 7B:
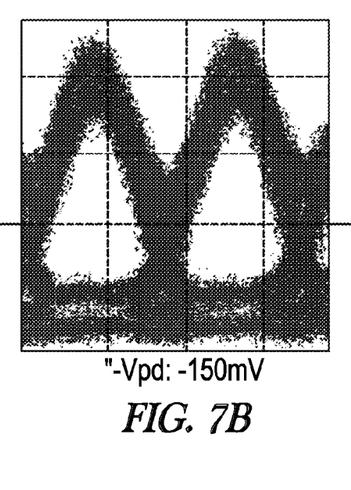
Figure 7C:
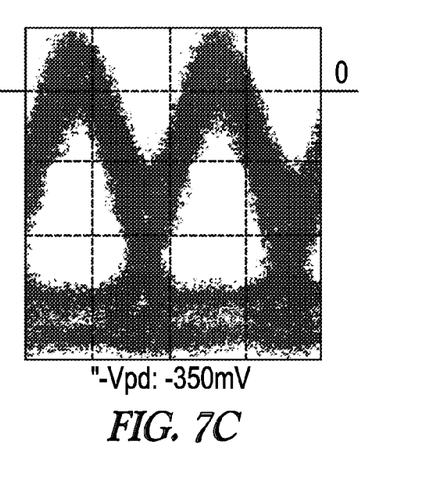

Three eye patterns or diagrams which are individually measured at the high-frequency output of the photoreceiver according to an embodiment of the invention (bias feeding photodetector), are represented in FIG. 7 and these demonstrate the optical signal conversion with a data rate of 107 Gbits/s. The optical input signal was produced by optical multiplexing of very short impulses with 2.6 ps width and represents a PRBS-sequence (pseudo-random binary sequence) of the statistics $2^{31}-1$. The eye diagrams demonstrate the ability of the new detector chip, to superimpose a selection-free bypass voltage through the chip for a successive electronics, on the high-frequency signal at their input, without having any influence on the quality or damping of the high-frequency signal of the detector or the photoreceiver. Accordingly, the signal eye, i.e. the representation of statistical "0" and "1" sequences, may be displaced infinitely about the zero axis by way of varying D.C. voltages at the connection path 11 or $-V_{pd}$. With this, the detector may be optimally adapted to the characteristics and requirements of subsequent electronics, without very expensive and damping (−2 db) bias-Ts having to be used in the 100 Gbit/s data rate range.

What is claimed is:

1. A photoreceiver arrangement with a photoreceiver, comprising:
   a photodiode having first and second terminals, the first terminal providing a biasing terminal for the photodiode, and the second terminal providing a DC-couplable single-ended signal output line of the photoreceiver,
   a blocking capacitor for high-frequency coupled between the biasing first terminal of the photodiode and an earth line; and
   a terminal resistance coupled to the signal output line of the photoreceiver,
      wherein the first terminal of the photodiode is connected to a first bias connection for supplying a blocking voltage, and
      wherein a second bias connection is connected to the terminal resistance for controlling the dc-potential at the signal output line, and the photoreceiver comprises a further blocking capacitor, coupled between the second bias connection and the earth line, for the high-frequency-technological earthing of the terminal resistance.

2. The photoreceiver arrangement according to claim 1, wherein the terminal resistance is connected between the second bias connection and the signal output line.

3. The photoreceiver arrangement according to claim 2, wherein two earth lines are provided for the high-frequency-technological symmetrisation, and the blocking capacitor, the further blocking capacitor and the terminal resistance are respectively divided into two part elements.

4. The photoreceiver arrangement according to claim 1, wherein the terminal resistance is a linear, ohmic resistance.

5. The photoreceiver arrangement according to claim 1, wherein the first bias connection is divided into two part bias connections.

6. The photoreceiver arrangement according to claim 1, wherein the photodiode includes a pin-photodiode, MSM-photodiode, or an avalanche photodiode.

7. The photoreceiver arrangement according to claim 1, wherein the photodiode (PD) is integrated vertically or laterally and/or is designed as a pin-Mesa diode in waveguide integration.

8. The photoreceiver arrangement according to claim 1, wherein the photodiode, the blocking capacitors, the terminal resistance and the bias connections are integrated on a chip.

9. The photoreceiver arrangement according to claim 1, wherein the photodiode is connected in a manner such that the anode is directed to the signal output line or that the cathode is directed to the signal output line.

10. The photoreceiver arrangement according to claim 1, wherein the signal output line is connected to a downstream electronic circuit, in particular to a demultiplexer or an amplifier, wherein the photoreceiver and the downstream electronic circuit, are integrated on a chip and/or are tightly packaged in a housing.

11. The photoreceiver arrangement according to claim 1, wherein the signal output line is directly connected to a downstream electronic circuit, in particular to a demultiplexer or an amplifier, wherein the photoreceiver and the downstream electronic circuit are arranged in separate chips and/or housings.

12. A method for operating a photoreceiver, which converts an optical data flow into a high-frequency output signal delivered to DC-couplable single-ended signal output of the photoreceiver, said method supplying a photodiode at a first terminal via a bias connection with a blocking voltage, blocking the high frequency at the bias connection by a blocking capacitor connected to the first terminal of the photodiode and to a ground connection, and providing a terminal resistance that is connected to the signal output, wherein via a second bias connection a dc voltage is supplied to the terminal resistance with which a potential for the linear control of the potential at the signal output via the terminal resistance is applied, and wherein the terminal resistance is earthed with regard to high frequencies by a further blocking capacitor that is connected between the second bias connection and earth.

13. The method according to claim 12, wherein the potentials at the bias connections are selected depending on the switch direction of the photodiode, wherein the potential at the second bias connection with regard to magnitude, is smaller than that at the first bias connection.

* * * * *

UNITED STATES PATENT AND TRADEMARK OFFICE
CERTIFICATE OF CORRECTION

PATENT NO. : 8,466,405 B2  
APPLICATION NO. : 12/881532  
DATED : June 18, 2013  
INVENTOR(S) : Heinz-Gunter Bach Page 1 of 1

It is certified that error appears in the above-identified patent and that said Letters Patent is hereby corrected as shown below:

On the title page, in column 2, under "Abstract", line 1, delete "photodetector" and insert --photoreceiver--, therefor In the Claims Column 7, line 15-16, in Claim 1, delete "photoreceiver," and insert --photoreceiver;--, therefor Column 7, line 27-28, in Claim 1, after "comprises", insert --¶--, therefor Signed and Sealed this  
Eighteenth Day of November, 2014

Michelle K. Lee  
*Deputy Director of the United States Patent and Trademark Office*